US009612129B2

(12) United States Patent
Azose et al.

(10) Patent No.: US 9,612,129 B2
(45) Date of Patent: *Apr. 4, 2017

(54) CONTROLLING MEDIA OUTPUT DURING CONSECUTIVE NAVIGATION INTERRUPTIONS

(71) Applicant: Google Inc., Mountain View, CA (US)

(72) Inventors: Benjamin Albert Azose, Menlo Park, CA (US); Zuiena Kabir, San Jose, CA (US)

(73) Assignee: Google Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/165,785

(22) Filed: May 26, 2016

(65) Prior Publication Data

US 2016/0273932 A1   Sep. 22, 2016

Related U.S. Application Data

(63) Continuation of application No. 14/334,428, filed on Jul. 17, 2014, now Pat. No. 9,354,074.

(51) Int. Cl.
| | | |
|---|---|---|
| *G01C 21/00* | (2006.01) | |
| *G01C 22/00* | (2006.01) | |
| *G05D 1/00* | (2006.01) | |
| *G01C 21/36* | (2006.01) | |
| *H03G 3/20* | (2006.01) | |

(52) U.S. Cl.
CPC ........ *G01C 21/3629* (2013.01); *G01C 21/36* (2013.01); *G01C 21/3626* (2013.01); *G01C 21/3655* (2013.01); *G01C 21/3697* (2013.01); *H03G 3/20* (2013.01)

(58) Field of Classification Search
CPC .......... G08G 1/096861; G08G 1/0969; G08G 1/096827; G08G 1/096872; G01C 21/3629
USPC ...................................................... 701/428
See application file for complete search history.

(56) References Cited

U.S. PATENT DOCUMENTS

| | | | |
|---|---|---|---|
| 8,700,320 B1 | 4/2014 | Teicher | |
| 2010/0222078 A1 | 9/2010 | Tysowski | |
| 2013/0093958 A1* | 4/2013 | Yoshikawa | ........ G01C 21/3661 348/705 |
| 2016/0018235 A1 | 1/2016 | Azose et al. | |

OTHER PUBLICATIONS

International Search Report and Written Opinion of international application PCT/US2015/034209, dated Dec. 18, 2015, 10 pgs.

* cited by examiner

*Primary Examiner* — Maceeh Anwari
(74) *Attorney, Agent, or Firm* — Shumaker & Sieffert, P.A.

(57) ABSTRACT

In one example, a method includes outputting, by a computing device, media, and performing, by the computing device and prior to output of a first navigation instruction from a plurality of navigation instructions, an adjustment to the outputting of the media. In this example, the method also includes determining, based at least in part on a second navigation instruction from the plurality of navigation instructions, that an interruption condition will be satisfied until after output of the second navigation instruction, and responsive to the determining, maintaining the adjustment to the outputting of the media until after output of the second navigation instruction.

20 Claims, 5 Drawing Sheets

CONTROLLING MEDIA OUTPUT DURING CONSECUTIVE NAVIGATION INTERRUPTIONS

This application is a continuation of U.S. patent application Ser. No. 14/334,428 filed Jul. 17, 2014, which is incorporated herein by reference in its entirety.

BACKGROUND

Mobile computing devices may be capable of performing a wide variety of operations such as providing route guidance to a particular destination, accessing the Internet, executing gaming applications, playing media, sending and receiving messages, as well as providing functionality of a traditional cellular telephone. When providing route guidance to a particular destination, a computing device may output one or more navigation instructions (e.g., graphically and/or audibly). As the computing device outputs the navigation instructions, the computing device may concurrently perform other operations that also generate output. For instance, the computing device may be capable of concurrently outputting audible navigation instructions and other audio content (such as music, spoken content, etc.). Some computing devices may interrupt the outputting of audio content in order to output a navigation instruction. However, the repeated interruption of audio content over a short period of time may be undesirable in some circumstances, as it may degrade the user experience.

SUMMARY

In one example, a method includes outputting, by a computing device, media, and performing, by the computing device and prior to output of a first navigation instruction from a plurality of navigation instructions, an adjustment to the outputting of the media. In this example, the method also includes determining, based at least in part on a second navigation instruction from the plurality of navigation instructions, that an interruption condition will be satisfied until after output of the second navigation instruction. In this example, the method also includes, responsive to the determining, maintaining the adjustment to the outputting of the media until after output of the second navigation instruction.

In another example, a computing device includes one or more processors; and at least one module executable by the one or more processors. In this example, the at least one module is executable by the one or more processors to output media, and perform, prior to output of a first navigation instruction from a plurality of navigation instructions, an adjustment to the output of the media. In this example, the at least one module is also executable by the one or more processors to determine, based at least in part on a second navigation instruction from the plurality of navigation instructions, that an interruption condition will be satisfied until after output of the second navigation instruction, and responsive to the determining, maintain the adjustment to the output of the media until after output of the second navigation instruction.

In another example, a computing system includes means for outputting media, and means for outputting a plurality of navigation instructions. In this example, the computing system also includes means for performing, prior to outputting of a first navigation instruction from the plurality of navigation instructions, an adjustment to the means for outputting the media, and means for determining, based at least in part on a second navigation instruction from the plurality of navigation instructions, that an interruption condition will be satisfied until after output of the second navigation instruction. In this example, the computing system also includes means for maintaining the adjustment to the means for outputting the media until after output of the second navigation instruction responsive to that the interruption condition will be satisfied until after output of the second navigation instruction.

In another example, non-transitory computer-readable storage medium stores instructions that, when executed, cause one or more processors of a computing device to output media, and perform, prior to output of a first navigation instruction from a plurality of navigation instructions, an adjustment to the output of the media. In this example, the non-transitory computer-readable storage medium stores instructions that, when executed, cause the one or more processors of the computing device to determine, based at least in part on a second navigation instruction from the plurality of navigation instructions, that an interruption condition will be satisfied until after output of the second navigation instruction, and responsive to the determining, maintain the adjustment to the output of the media until after output of the second navigation instruction.

The details of one or more examples of the disclosure are set forth in the accompanying drawings and the description below. Other features, objects, and advantages will be apparent from the description and drawings, and from the claims.

DETAILED DESCRIPTION

In general, techniques of the disclosure are directed to maintaining an adjustment of media output (e.g., pausing and/or adjusting a volume the media) by a computing device between one or more consecutive navigation instructions that together satisfy an interruption condition. An example interruption condition may be satisfied by two successive navigation instructions likely to be output within a particular amount of time.

In instances when a computing device is currently outputting audio content, the computing device may, prior to outputting a particular navigation instruction, lower or mute an output volume of the audio content. In accordance with techniques of the disclosure, the computing device may also determine an amount of time between the particular navigation instruction and a next navigation instruction scheduled to be output by the computing device. If the amount of time between the particular navigation instruction and the next navigation instruction is less than a particular amount of time (such as a predetermined amount of time), the computing device will maintain the lowered or muted output volume for the audio content. In this way, as opposed to adjusting the output of media to allow for the unimpeded outputting of each individual navigation instruction, the computing device may maintain an adjustment to the output of the media between the outputting of successive navigation instructions. As such, techniques of the disclosure may decrease and/or eliminate a rapid alternation between media output and navigation instruction output over a defined period of time in instances where multiple navigation instructions occur within a particular amount of time.

Figure 1:
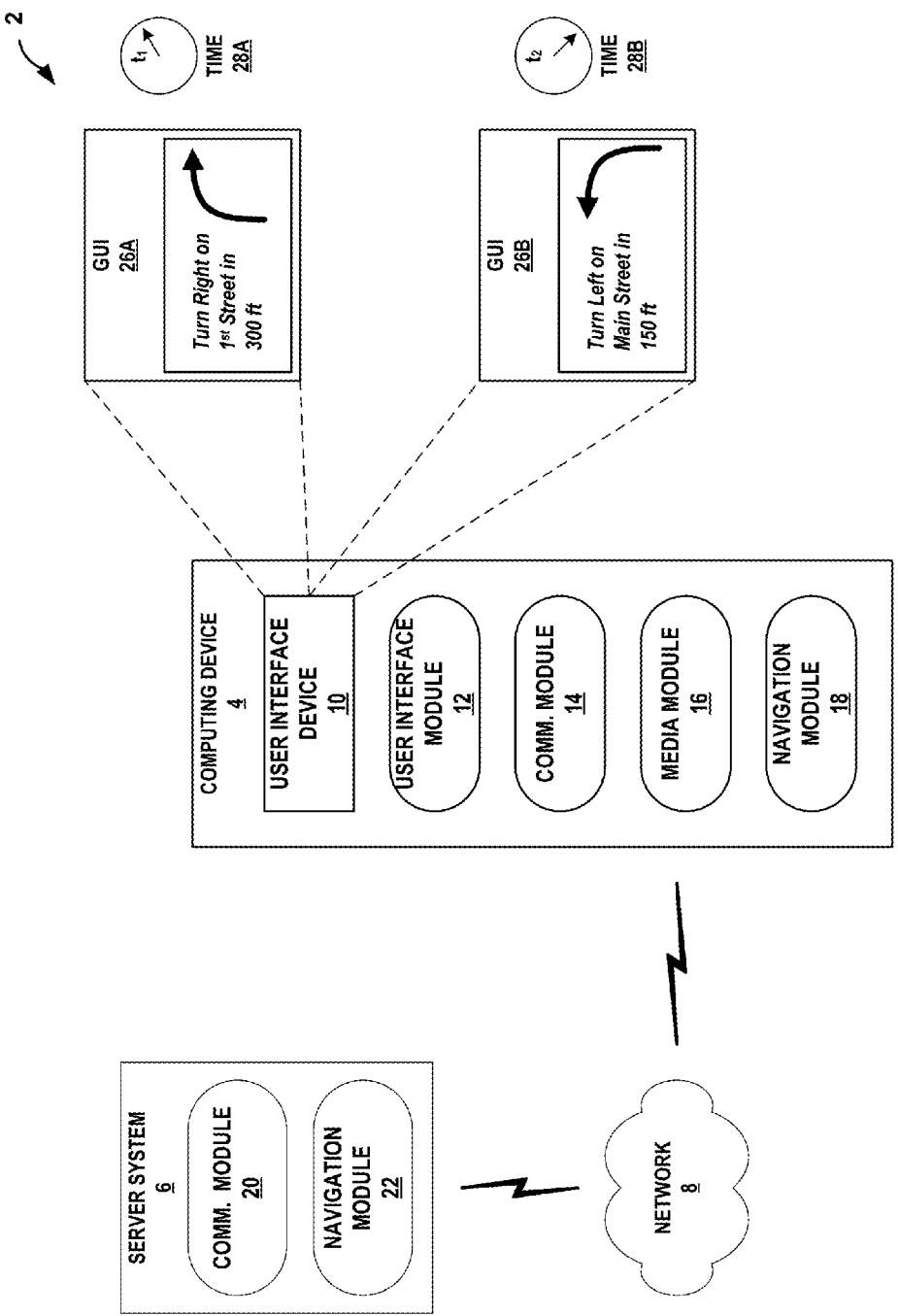
FIG. 1 is a block diagram illustrating an example system for maintaining adjustment of media output by a computing device between successive navigation instructions that satisfy an interruption condition, in accordance with one or more techniques of the present disclosure.

FIG. 1 is a block diagram illustrating an example system for maintaining adjustment of media output by a computing device between successive navigation instructions that satisfy an interruption condition, in accordance with one or more techniques of the present disclosure. As shown in the example of FIG. 1, system 2 includes computing device 4, server system 6, and network 8. In some examples, computing device 4 may be operatively and/or communicatively coupled to server system 6 by network 8.

In the example of FIG. 1, computing device 4 includes user interface device 10 ("UID 10"), User interface module 12 ("UIM 12"), communication module 14, media module 16, and navigation module 18. Examples of computing device 4 may include, but are not limited to, portable or mobile devices such as mobile phones (including smart phones), wearable computing devices, tablet computers, cameras, personal digital assistants (PDAs), automotive infotainment devices, etc. Other examples of computing device 4 that implement techniques of this disclosure may include additional components not shown in FIG. 1.

In some examples, computing device 4 may include UID 10. A user associated with computing device 4 may interact with computing device 4 by providing various user inputs into computing device 4, e.g., using the at least one UID 10. In some examples, UID 10 is configured to receive tactile, audio, or visual input. In addition to receiving input from a user, UID 10 can be configured to output content, such as a graphical user interface (GUI) for display and/or audio content for playback. In some examples, UID 10 can include a display and/or a presence-sensitive input device. In some examples, the presence-sensitive input device and the display may be integrated into a presence-sensitive display, which displays the GUI and receives input from the user using capacitive, inductive, surface acoustic wave, and/or optical detection at or near the presence sensitive display. In other examples, the display device can be physically separate from a presence-sensitive device included in computing device 4. In some examples, UID 10 may include one or more audio playback devices, such as one or more speakers, one or more audio outputs (e.g., headphone jacks, wireless speaker connections, etc.), and the like.

As shown in FIG. 1, computing device 4 may also include UIM 12. UIM 12 can perform one or more functions to receive an indication of input, such as user input, and send the indications of the input to other components associated with computing device 4, such as navigation module 18. UIM 12 may receive indications of user input from various sources, such as UID 10, communication module 14, a network interface, or a user input device. Using the data, UIM 12 may cause other components associated with computing device 4, such as UID 10, to provide output based on the data.

Computing device 4 can also include communication module 14. In some examples, communication module 14 may manage communications between computing device 4 and an external server, such as server system 6. For instance, communication module 14 may receive data from server system 6. As one example, communication module 14 may receive navigation instructions from server system 6. As another example, communication module 14 may receive traffic data from server system 6. In some examples, communication module 14 may provide the received information to other components of computing device 4. For example, communication module 14 may provide the received navigation instructions to navigation module 18.

In some examples, computing device 4 may include media module 16 which may include functionality to output media data (e.g., audio and/or video data). In some examples, media module 16 may output the media data by causing UID 10 to playback the media data. For instance, media module 16 may output video data for playback at a display of UID 10 and/or audio data for playback at an audio playback device of UID 10. Media module 16 may be configured to adjust the outputting of the media, e.g., in response to receiving instructions from navigation module 18. In some examples, media module 16 may adjust the outputting of the media by pausing the outputting of the media, and/or lowering a volume level of the media playback. Media module 16 may be configured to terminate the adjustment of the outputting of the media, e.g., in response to receiving instructions from navigation module 18. In some examples, after terminating the adjustment, media module 16 may step-back or "rewind" the media such that there is some overlap between the media data output prior to the adjustment and the media data output after termination of the adjustment. For instance, media module 16 may re-output a period (e.g., approximately 3 to approximately ten seconds) of media data after termination of the adjustment.

In some examples, computing device 4 may include navigation module 18 which may include functionality to perform route guidance. For instance, navigation module 18 may perform route guidance by outputting one or more navigation instructions determined based on a starting location and a destination location. In some examples, navigation module 18 may receive user input that indicates the starting location and/or the destination location via UID 10 and UIM 12. In other examples, navigation module 18 may an indication of the starting location and/or the destination location from server system 6 via network 8.

Navigation module 18 may output a navigation instruction by outputting one or both of an audible navigation instruction and a graphical navigation instruction. In some examples, navigation module 18 may be configured to determine when to output the navigation instructions. As one example, navigation module 18 may determine when to output the navigation instruction based on a location and/or speed of computing device 4. In some examples, navigation module 18 may be configured to determine the location and/or speed of computing device 4 based on global positioning system (GPS) data, Galileo positioning data, indoor positioning system data (IPS), and the like. As another example, navigation module 18 may determine when to output the navigation instruction based on traffic data, which may be received from server system 6.

As discussed above, navigation module 18 may be configured to adjust output of media when outputting the navigation instructions. For instance, navigation module 18 may determine when an interruption condition will be satisfied between output of two or more consecutive navigation instructions. Where navigation module 18 determines that the interruption condition will be satisfied between output of two or more consecutive navigation instructions, navigation module 18 may maintain adjustment of the output of the media until after outputting a last navigation instruction of the two or more consecutive navigation instructions.

In situations in which the systems discussed herein, such as navigation module 18 and/or navigation module 22 of server system 6, may collect personal information about the user, or may make use of the user's personal information, the user may be provided with an opportunity to control whether, and to what extent, programs or features collect the user's information (e.g., information about the user's social network, social actions or activities, profession, the user's preferences, or the user's current location), or to control whether and/or how to receive content from the content server that may be more relevant to the user. In addition, certain data may be treated in one or more ways before it is stored or used, so that personally identifiable information is removed. For example, the user's identity may be treated so that no personally identifiable information can be determined for the user, or the user's geographic location may be generalized where location information is obtained (such as to a city, ZIP code, or state level), so that a particular location of the user cannot be determined. Thus, the user may have control over how information is collected about the user and used by a content server.

Any of UIM 12, communication module 14, media module 18, and navigation module 18 (collectively the "computing device modules") may be implemented in various ways. For example, one or more of the computing device modules can be implemented as a downloadable or pre-installed application or "app." In another example, one or more of the computing device modules can be implemented as part of a hardware unit of computing device 4. In another example, one or more of the computing device modules can be implemented as part of an operating system of computing device 4.

In the example of FIG. 1, server system 6 includes communication module 30, and navigation module 22. Examples of server system 6 may include, but are not limited to desktop computers, laptop computers, mainframes, servers, cloud computing systems, and/or combinations of the same.

Communication module 20 may manage communications between server system 6 and a computing device, such as computing device 4. For instance, communication module 20 may exchange information with computing device 4. As one example, communication module 20 may send navigation instructions computing device 4. As another example, communication module 20 may receive a request for navigation instructions from computing device 4. In some examples, communication module 20 may exchange information with other components of server system 6. For example, communication module 20 may provide the received request for navigation instructions to navigation module 22.

Navigation module 22 may include functionality to perform route guidance. For instance, navigation module 22 may perform route guidance by outputting, for transmission to computing device 4, a plurality of navigation instructions. For instance, as opposed to calculating a route between the starting location and the destination location on computing device 4, server system 6 may calculate the route and transmit the corresponding navigation instructions to computing device 4. In some examples, navigation module 22 may output a syntax element that indicates which navigation instructions of the plurality of navigation instructions satisfy or are likely to satisfy the interruption condition. In some examples, navigation module 22 may be configured to output traffic data for transmission to computing device 4.

Any of communication module 20, and navigation module 32 (collectively the "server system modules") may be implemented in various ways. For example, one or more the server system modules can be implemented as a downloadable or pre-installed application or "app." In another example, one or more of the server system modules can be implemented as part of a hardware unit of server system 6. In another example, one or more of the server system modules can be implemented as part of an operating system of server system 6.

As discussed above, computing device 4 may adjust output of media when outputting of navigation instructions. Rather than terminating the adjustment of the output of the media after outputting each individual navigation instruction, techniques of this disclosure may enable computing device 4 and/or server system 6 to maintain the adjustment of the media output by computing device 4 between consecutive navigation instructions of a plurality of navigation instructions that satisfy an interruption condition.

A user of computing device 4 may utilize computing device 4 to perform route guidance. For instance, UIM 12 may receive an indication of user input from UID 10 that indicates a starting location and a destination location. UIM 12 may provide the indication of the user input to navigation module 18 which may determine a plurality of navigation instructions that indicate a route between the starting location and the destination location. As discussed above, navigation module 18 may determine the plurality of navigation instructions locally or may receive assistance from server system 6.

Additionally, the user of computing device 4 may desire to consume some media while navigating. For instance, UIM 12 may receive an indication of user input from UID 10 that indicates a media selection. UIM 12 may provide the indication of the user input to media module 16 which may output the selected media. As discussed above, media module 16 may output the media via one or both of UID 10 and communication module 14.

In any case, at first time 28A, navigation module 18 may output a first navigation instruction of the plurality of navigation instructions. For instance, navigation module 18 may output the first navigation instruction by outputting a graphical representation of the first navigation instruction, such as GUI 26A, and an audible representation of the first navigation instruction. As illustrated in FIG. 1, the graphical representation of the first navigation instruction may include one or more of text (e.g., "Turn Right on $1^{st}$ Street in 300 ft") and symbols (e.g., a right arrow). In some examples, the audible representation of the first navigation instruction may be a voice rendering of the text included in the graphical representation of the first navigation instruction.

Responsive to output of the first navigation instruction, navigation module 18 may cause media module 16 to adjust the outputting of the media. For instance, navigation module 18 may cause media module 16 to reduce the volume of the media while the audible representation of the first navigation instruction is being output.

Navigation module 18 may determine whether an interruption condition will be satisfied until after output of a second navigation instruction. In some examples, navigation module 18 may determine whether the interruption condition will be satisfied based on one or more of: a distance indicated by the second navigation instruction, and a predicted output time of the second navigation instruction.

In some examples, navigation module 18 may determine whether the interruption condition will be satisfied when first determining the plurality of navigation instructions. In some examples, navigation module 18 may periodically determine whether the interruption condition will be satisfied. For instance, navigation module 18 may determine whether the interruption condition will be satisfied until after output of the second navigation instruction while outputting (or shortly before outputting) the first navigation instruction.

In any case, responsive to determining that the interruption condition will be satisfied until after output of the second navigation instruction, navigation module 18 may cause media module 16 to maintain the adjustment of the outputting of the media until after navigation module 18 has output the second navigation instruction.

At second time 28B, navigation module 18 may output the second navigation instruction. Similar to the output of first navigation instruction, navigation module 18 may output the second navigation instruction by outputting a graphical representation of the second navigation instruction, such as GUI 26B, and an audible representation of the second navigation instruction. After outputting the second navigation instruction, navigation module 18 may cause media module 16 to terminate the adjustment of the outputting of the media. As such, navigation module 18 may cause media module 16 to maintain the adjustment of the outputting of the media from first time 28A until second time 28B (plus the time used to output the audible representation of the second navigation instruction).

Navigation module 18 may determine whether an interruption condition will be satisfied until after output of a last navigation instruction of a group of consecutive navigation instructions. In some examples, navigation module 18 may determine whether the interruption condition will be satisfied based on one or more of: respective distances indicated by the one or more consecutive navigation instructions, and predicted output times of the one or more consecutive navigation instructions. In some examples, the last navigation instruction of the group of consecutive navigation instructions may be the last navigation instruction in the plurality of navigation instructions. In other examples, there may be additional navigation instructions after the last navigation instruction of the group of consecutive navigation instructions.

In some examples, navigation module 18 may determine whether the interruption condition will be satisfied when first determining the plurality of navigation instructions. In some examples, navigation module 18 may periodically determine whether the interruption condition will be satisfied.

In any case, responsive to determining that the interruption condition will be satisfied until after output of the last navigation instruction of the group of consecutive navigation instructions, navigation module 18 may cause media module 16 to maintain the adjustment of the outputting of the media until after navigation module 18 has output the last navigation instruction of the group of consecutive navigation instructions. After outputting the last navigation instruction of the group of consecutive navigation instructions, navigation module 18 may cause media module 16 to terminate the adjustment of the outputting of the media. In this way, computing device 4 may maintain adjustment of media output between successive navigation instructions.

Figure 2:
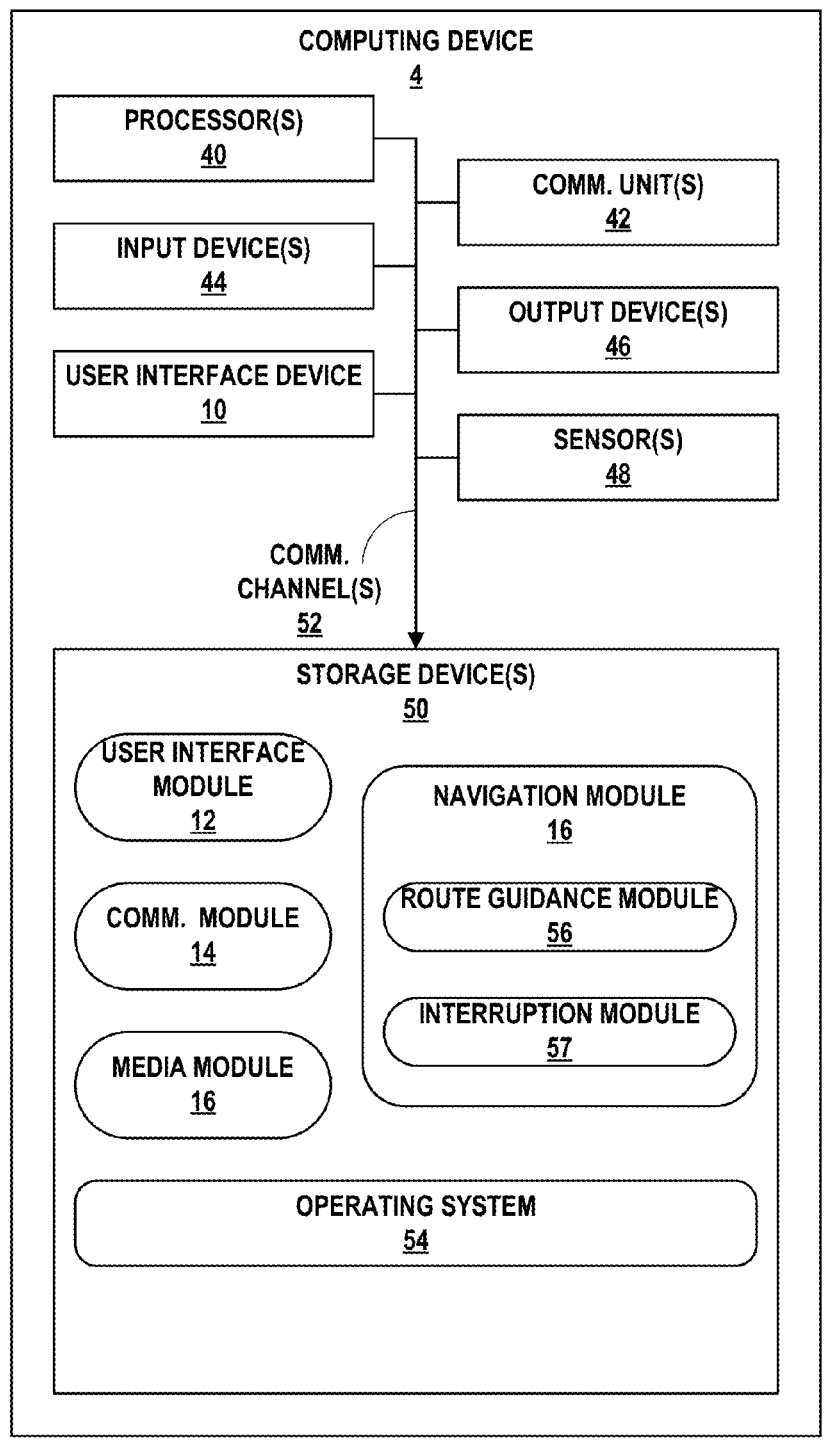
FIG. 2 is a block diagram illustrating an example computing device that maintains adjustment of media output between successive navigation instructions, in accordance with one or more techniques of the present disclosure.

FIG. 2 is a block diagram illustrating an example computing device that maintains adjustment of media output between successive navigation instructions, in accordance with one or more techniques of the present disclosure. FIG. 2 illustrates one particular example of computing device 4, and many other examples of computing device 4 may be used in other instances and may include a subset of the components included in example computing device 4 or may include additional components not shown in FIG. 2.

As shown in the example of FIG. 2, computing device 4 includes one or more processors 40, one or more communication units 42, one or more input devices 44, one or more output devices 46, user interface device 10 ("UID 10"), one or more sensors 48, and one or more storage devices 50. Storage devices 50 of computing device 4 also include user interface module 12 ("UIM 12"), communication module 14, reminder module 16, and operating system 54. Computing device 4 can include additional components that, for clarity, are not shown in FIG. 2. For example, computing device 4 can include a battery to provide power to the components of computing device 4. Similarly, the components of computing device 4 shown in FIG. 2 may not be necessary in every example of computing device 4. For example, in some configurations, computing device 4 may not include output devices 46.

Communication channels 52 may interconnect each of the components 10, 40, 42, 44, 46, 48, and 50 for inter-component communications (physically, communicatively, and/or operatively). In some examples, communication channels 52 may include a system bus, a network connection, an inter-process communication data structure, or any other method for communicating data.

One or more processors 40 may implement functionality and/or execute instructions within computing device 4. For example, processors 40 on computing device 4 may receive and execute instructions stored by storage devices 50 that execute the functionality of modules 12, 14, 16, and 18. These instructions executed by processors 40 may cause computing device 4 to read/write/etc. information, such as one or more data files stored within storage devices 50 during program execution. Processors 40 may execute instructions of modules 12, 14, 16, and 18 to cause UID 10 to output one or more graphical indications (e.g., media selection menus, graphical navigation instructions) for display at UID 10 as content of a user interface. That is, modules 12, 14, 16, and 18 may be operable by processors 40 to perform various actions or functions of computing device 4, for instance, causing UID 10 to a present a graphical user interface at UID 10.

One or more communication units 42 of computing device 4 may communicate with external devices via one or more wired and/or wireless networks by transmitting and/or receiving network signals on the one or more networks. Examples of communication unit 42 include a network interface card (e.g. such as an Ethernet card), an optical transceiver, a radio frequency transceiver, a GPS receiver, or any other type of device that can send and/or receive information. Other examples of communication units 42 may include short wave radios, cellular data radios, wireless network radios, as well as universal serial bus (USB) controllers.

One or more input devices 44 of computing device 4 may receive input. Examples of input are tactile, audio, and video input. One or more of input devices 44 of computing device 4, in one example, may include a presence-sensitive display, touch-sensitive screen, mouse, keyboard, voice responsive system, video camera, microphone, steering wheel mounted controls, in-dash controls, or any other type of device for detecting input from a human or machine.

One or more output devices 46 of computing device 4 may generate output. Examples of output are tactile, audio, and video output. One or more of output devices 46 of computing device 4, in one example, may include a presence-sensitive display, sound card, video graphics adapter card, speaker, cathode ray tube (CRT) monitor, liquid crystal display (LCD), or any other type of device for generating output to a human or machine.

In some examples, UID 10 of computing device 4 may include functionality of input devices 44 and/or output devices 46. In the example of FIG. 2, UID 10 may be or may include a presence-sensitive input device. In some examples, a presence sensitive input device may detect an object at and/or near a screen. As one example range, a presence-sensitive input device may detect an object, such as a finger or stylus that is within two inches or less of the screen. The presence-sensitive input device may determine a location (e.g., an (x,y) coordinate) of a screen at which the object was detected. In another example range, a presence-sensitive input device may detect an object six inches or less from the screen and other ranges are also possible. The presence-sensitive input device may determine the location of the screen selected by a user's finger using capacitive, inductive, and/or optical recognition techniques. In some examples, presence sensitive input device also provides output to a user using tactile, audio, or video stimuli as described with respect to output device 46, e.g., at a display. In the example of FIG. 2, UID 10 may present one or more graphical user interfaces, such as graphical user interfaces 20 and 24 of FIG. 1.

While illustrated as an internal component of computing device 4, UID 10 also represents and external component that shares a data path with computing device 4 for transmitting and/or receiving input and output. For instance, in one example, UID 10 represents a built-in component of computing device 4 located within and physically connected to the external packaging of computing device 4 (e.g., a screen on a mobile phone). In another example, UID 10 represents an external component of computing device 4 located outside and physically separated from the packaging of computing device 4 (e.g., a monitor, a projector, etc. that shares a wired and/or wireless data path with a tablet computer).

Sensors 48 may be configured to detect a location of computing device 4 and may collect other information associated with computing device 4. For instance, sensors 48 may be configured to measure the geographical location, rotation, velocity, and/or acceleration of computing device 4. Examples of sensors 48 that detect and/or measure a location of computing device 4 may include, but are not limited to, speedometers, compasses, GPS receivers, indoor positioning sensors, accelerometers, and gyroscopes.

One or more storage devices 50 within computing device 4 may store information for processing during operation of computing device 4 (e.g., computing device 4 may store data that modules 12, 14, 16, and 18 may access during execution at computing device 4). In some examples, storage device 50 is a temporary memory, meaning that a primary purpose of storage device 50 is not long-term storage. Storage devices 50 on computing device 10 may configured for short-term storage of information as volatile memory and therefore not retain stored contents if powered off. Examples of volatile memories include random access memories (RAM), dynamic random access memories (DRAM), static random access memories (SRAM), and other forms of volatile memories known in the art.

Storage devices 50, in some examples, also include one or more computer-readable storage media. Storage devices 50 may be configured to store larger amounts of information than volatile memory. Storage devices 50 may further be configured for long-term storage of information as non-volatile memory space and retain information after power on/off cycles. Examples of non-volatile memories include magnetic hard discs, optical discs, floppy discs, flash memories, or forms of electrically programmable memories (EPROM) or electrically erasable and programmable (EEPROM) memories. Storage devices 50 may store program instructions and/or information (e.g., data) associated with modules 12, 14, 16, and 18 and operating system 54.

Operating system 54, in some examples, controls the operation of components of computing device 4. For example, operating system 54, in one example, facilitates the communication of UIM 12, communication module 14, and reminder module 16 with processors 40, one or more communication units 42, one or more input devices 44, one or more output devices 46, UID 10, and one or more sensors 48. UIM 12, communication module 14, and reminder module 16 may each include program instructions and/or data that are executable by computing device 4 (e.g., by one or more processors 40). As one example, reminder module 16 can include instructions that cause computing device 4 to perform one or more of the operations and actions described in the present disclosure.

UIM 12 may cause UID 10 to output a graphical user interface (e.g., graphical user interfaces 26A and 26B) for display, as a user of computing device 4 views output and/or provides input at UID 10. UIM 12 and UID 10 may receive one or more indications of input from a user as the user interacts with the graphical user interface, at different times and when the user and computing device 4 are at different locations. UIM 12 and UID 10 may interpret inputs detected at UID 10 (e.g., as a user provides one or more gestures at one or more locations of UID 10 at which the graphical user interface is displayed) and may relay information about the inputs detected at UID 10 to one or more associated platforms, operating systems, applications, and/or services executing at computing device 4, to cause computing device 4 to perform functions.

UIM 12 may receive information and instructions from one or more associated platforms, operating systems, applications, and/or services executing at computing device 4 (e.g., media module 16, navigation module 18, etc.) for generating a graphical user interface. In addition, UIM 12 may act as an intermediary between the one or more associated platforms, operating systems, applications, and/or services executing at computing device 4 and various output devices of computing device 4 (e.g., speakers, LED indicators, audio or electrostatic haptic output device, etc.) to produce output (e.g., a graphic, a flash of light, a sound, a haptic response, etc.) with computing device 4.

In accordance with one or more techniques of this disclosure, route guidance module (RGM) 56 of navigation module 16 may be operated by processors 40 to determine a plurality of navigation instructions that collectively form a route between a starting location and a destination location. In some examples, RGM 56 may determine the plurality of navigation instructions based on locally stored navigational data, such as one or more maps. In some examples, RGM 56 may determine the plurality of navigation instructions based on information received from one or more external devices, such as server system 6. As one example, RGM 56 may receive one or more maps from one or more external devices, such as server system 6, and locally determine the plurality of navigation instructions. As another example, RGM 56 may receive the plurality of navigation instructions from one or more external devices, such as server system 6.

In some examples, each of the plurality of navigation instructions may indicate one or more data points. As one example, a navigation instruction may indicate a particular navigational maneuver type (e.g., turn, merge, go straight, etc.). As another example, a navigation instruction may indicate one or more coordinates that specify where the navigational maneuver is to be performed (e.g., GPS coordinates of a particular turn in the route, an intersection where the particular turn is to be performed, etc.). As another example, a navigation instruction may indicate a distance until a navigational maneuver is to be performed (e.g., 100 ft, 10 miles, 100 miles). As another example, a navigation instruction may indicate a distance after a navigational maneuver is to be performed (e.g., 100 ft, 10 miles, 100 miles). As another example, a navigation instruction may indicate a time at which a navigational maneuver is predicted to be performed (e.g., a relative time such as five minutes from the current time, or an absolute time such as 10:30 AM). In some examples, the time at which a navigational maneuver is predicted to be performed may be referred to as a predicted output time of the corresponding navigational instruction.

In some examples, RGM 56 may update one or more of the data points indicated by one or more of the plurality of navigation instructions. As one example, RGM 56 may update a distance until a particular navigational maneuver is to be performed based on e.g., a current location of computing device 4 and one or more coordinates that specify where the particular navigational maneuver is to be performed. As another example, RGM 56 may update the time at which a particular navigational maneuver is predicted to be performed based on e.g., a current speed of computing device 4, a current location of computing device 4, one or more coordinates that specify where the particular navigational maneuver is to be performed, a speed limit of a way (e.g., road, street, path, trail, etc.) indicated the navigation instruction to be output prior to the particular navigation instruction, and/or traffic data. In some examples, RGM 56 may receive the traffic data from an external device, such as server system 6. In some examples, RGM 56 may provide an indication of the updated data points to interruption module 57 of navigation module 16.

Interruption module 57 may determine whether an interruption condition will be satisfied by one or more of the plurality of navigation instructions. In some examples, interruption module 57 may determine whether the interruption condition will be satisfied based on one or more of the data points indicated by the plurality of navigation instructions (e.g., predicted output time, distance before, distance after, coordinates, maneuver type, etc.). In some examples, interruption module 57 may determine whether the interruption condition will be satisfied when the plurality of navigation instructions are first received, periodically as the navigation instructions are outputted, and/or upon receiving updated data points from RGM 56.

As one example, where a first navigation instruction of the plurality of navigation instructions is predicted to be output at a first time and a second navigation instruction of the plurality of navigation instructions is predicted to be output at a second time, interruption module 57 may determine that the interruption condition will be satisfied until after output of the second navigation instruction where a difference between the first time and the second time is less than a threshold amount of time. To continue with this example, where a third navigation instruction of the plurality of navigation instructions is predicted to be output at a third time, interruption module 57 may determine that the interruption condition will continue to be satisfied until after output of the third navigation instruction where a difference between the second time and the third time is less than the threshold amount of time. In some examples, interruption module 57 may determine whether the interruption will be satisfied determining a shortest interval between the predicted output times of any two subsequent navigation instructions and then iterating by one navigation instruction out in either direction.

As another example, where a distance after the navigation maneuver indicated by a particular navigation instruction is less than a threshold distance, interruption module 57 may determine that the interruption condition will be satisfied until after output of a next navigation instruction (e.g., the navigation instruction that sequentially follows the particular navigation instruction). As another example, where a distance before the navigation maneuver indicated by a particular navigation instruction is less than a threshold distance, interruption module 57 may determine that the interruption condition will be satisfied until after output of the particular navigation instruction.

As discussed above, RGM 56 may update one or more of the data points indicated by one or more of the plurality of navigation instructions. Similarly, interruption module 57 may update the determination of whether the interruption condition will be satisfied. As one example, where interruption module 57 has previously determined that the interruption condition will be satisfied until after output of a second navigation instruction, such as where a difference between a predicted output time for a first navigation instruction of the plurality of navigation instructions and a predicted output time for a second navigation instruction of the plurality of navigation instructions is less than the threshold amount of time, interruption module 57 may, responsive to receiving a revised predicted output time for the second navigation instruction, determine that the interruption condition will not be satisfied until after output of the second navigation instruction where a difference between the predicted output time for the first navigation instruction the revised predicted output time for the second navigation instruction greater than the threshold amount of time.

Figure 3:
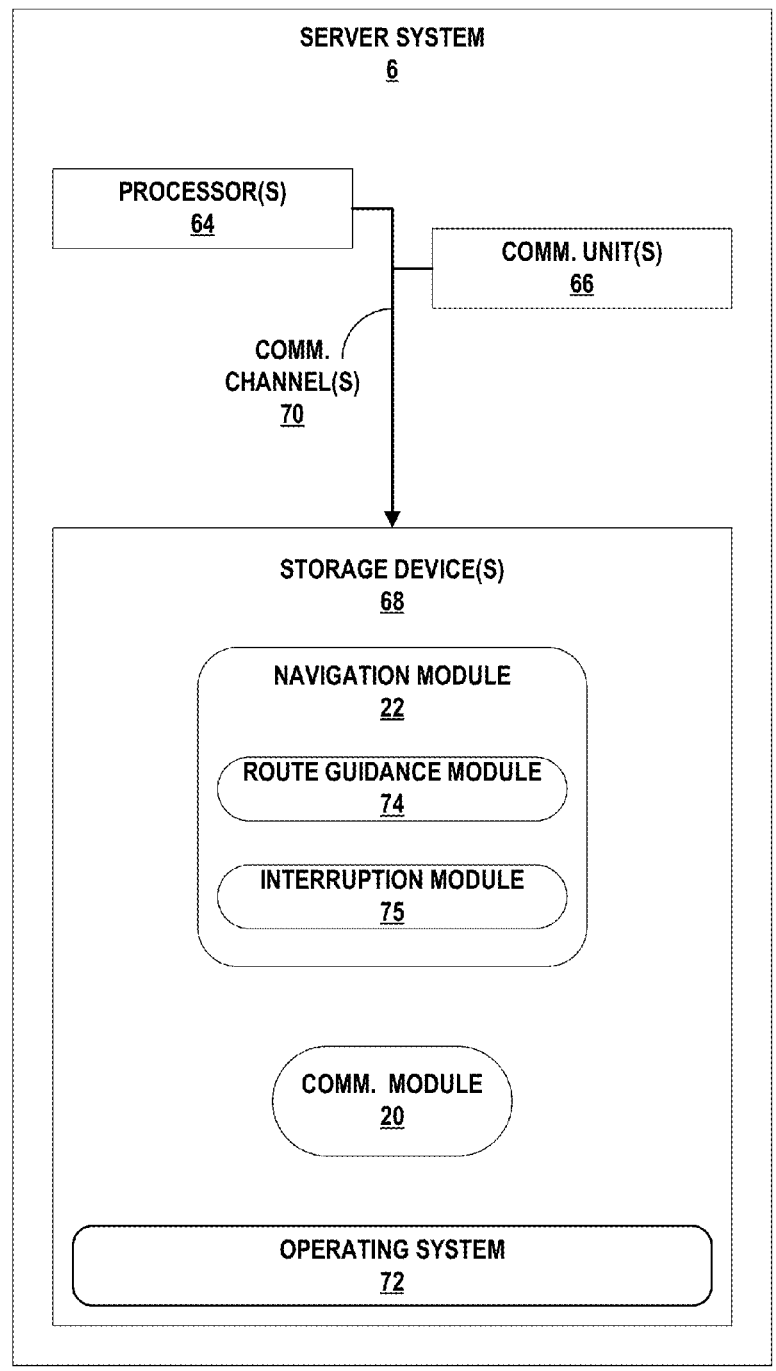
FIG. 3 is a block diagram illustrating an example server system, in accordance with one or more techniques of the present disclosure.

As another example, interruption module 57 may determine that the interruption condition will be satisfied until after output of a particular navigation instruction based on an indication received from an external device, such as server system 6 of FIG. 3. For instance, interruption module 57 may receive a flag for one of more of the navigation instructions that indicates whether the interruption condition will be satisfied until after output of each respective navigation instruction of the one or more navigation instructions.

As another example, interruption module 57 may determine that the interruption condition will be satisfied based on a frequency of the navigation instructions. For instance, where the likelihood that a group of navigation instructions will be output during a particular amount of time is above a threshold likelihood, interruption module 57 may determine that the interruption condition will be satisfied until after output of a final navigation instruction of the group of navigation instructions responsive to determining that a quantity of navigation instructions included in the group of navigation instructions is greater than a threshold quantity (e.g., 2 navigation instructions per minute, 5 navigation instructions per minute, etc.).

In any case, responsive to determining that the interruption condition will be satisfied until after output of a particular navigation instruction, interruption module 57 may cause media module 16 to maintain adjustment of the outputting of media until after output of the particular navigation instruction. For instance, where interruption module 57 determines that the interruption condition will be satisfied until after output of a second navigation instruction that is directly subsequent to a first navigation instruction, interruption module 57 may cause media module 16 to perform an adjustment to output of media of responsive to output of the first navigation instruction and maintain the adjustment to the output of the media until after output of the second navigation instruction. As one example, interruption module 57 may cause media module 16 to pause the output of music before RGM 56 outputs the first navigation instruction and keep the output of the music paused until after RGM 56 outputs the second navigation instruction. In this way, interruption module 57 may decrease and/or eliminate a rapid alternation between media output and navigation instruction output.

FIG. 3 is a block diagram illustrating an example server system that reminds a user of his/her interest in a product, in accordance with one or more techniques of the present disclosure. FIG. 3 illustrates one particular example of server system 6, and many other examples of server system 6 may be used in other instances and may include a subset of the components included in example server system 6 or may include additional components not shown in FIG. 3.

As shown in the example of FIG. 3, server system 6 includes one or more processors 64, one or more communication units 66, and one or more storage devices 68. Storage devices 68 of server system 6 also include communication module 30, reminder module 32, and operating system 72. Server system 6 can include additional components that, for clarity, are not shown in FIG. 3. For example, server system 6 can include multiple server devices over which the computing load of server system 6 may be distributed. Similarly, the components of server system 6 shown in FIG. 3 may not be necessary in every example of server system 6.

Communication channels 70 may interconnect each of the components 64, 66, and 68 for inter-component communications (physically, communicatively, and/or operatively). In some examples, communication channels 70 may include a system bus, a network connection, an inter-process communication data structure, or any other method for communicating data.

One or more processors 64 may implement functionality and/or execute instructions within server system 6. For example, processors 64 on server system 6 may receive and execute instructions stored by storage devices 68 that execute the functionality of modules 30 and 32. These instructions executed by processors 64 may cause server system 6 to read/write/etc. information, such as one or more data files stored within storage devices 68 during program execution.

One or more communication units 66 of server system 6 may communicate with external devices via one or more wired and/or wireless networks by transmitting and/or receiving network signals on the one or more networks. Examples of communication unit 66 include a network interface card (e.g. such as an Ethernet card), an optical transceiver, a radio frequency transceiver, a GPS receiver, or any other type of device that can send and/or receive information. Other examples of communication units 66 may include short wave radios, cellular data radios, wireless network radios, as well as universal serial bus (USB) controllers.

One or more storage devices 68 within server system 6 may store information for processing during operation of server system 6 (e.g., server system 6 may store data that modules 30 and 32 may access during execution at server system 6). In some examples, storage device 68 is a temporary memory, meaning that a primary purpose of storage device 68 is not long-term storage. Storage devices 68 on server system 6 may be configured for short-term storage of information as volatile memory and therefore not retain stored contents if powered off. Examples of volatile memories include random access memories (RAM), dynamic random access memories (DRAM), static random access memories (SRAM), and other forms of volatile memories known in the art.

Storage devices 68, in some examples, also include one or more computer-readable storage media. Storage devices 68 may be configured to store larger amounts of information than volatile memory. Storage devices 68 may further be configured for long-term storage of information as non-volatile memory space and retain information after power on/off cycles. Examples of non-volatile memories include magnetic hard discs, optical discs, floppy discs, flash memories, or forms of electrically programmable memories (EPROM) or electrically erasable and programmable (EEPROM) memories. Storage devices 68 may store program instructions and/or information (e.g., data) associated with modules 20 and 22 and operating system 72.

Operating system 72, in some examples, controls the operation of components of server system 6. For example, operating system 72, in one example, facilitates the communication of communication module 20 and navigation module 22 with processors 64 and one or more communication units 66. Communication module 20 and navigation module 22 may each include program instructions and/or data that are executable by server system 6 (e.g., by one or more processors 64). As one example, reminder module 32 can include instructions that cause server system 6 to perform one or more of the operations and actions described in the present disclosure.

In accordance with one or more techniques of this disclosure, route guidance module (RGM) 74 of navigation module 22 may be operable by processors 64 to determine a plurality of navigation instructions that collectively form a route between a starting location and a destination location, and provide said plurality of navigation instructions to an external device, such as computing device 4 of FIGS. 1 and 2, via communication module 20. In some examples, RGM 74 may determine/provide the plurality of navigation instructions in response to receiving the starting location and the destination location from the external device. In some examples, RGM 74 may also send one or more maps and/or traffic data to the external device.

Interruption module 75 of navigation module 22 may be operable by processors 64 to perform operations similar to interruption module 57 of computing device 4. For instance, interruption module 22 may determine whether an interruption condition will be satisfied by one or more of the plurality of navigation instructions. Interruption module 75 may output, for transmission to computing device 4, an indication of which navigation instructions of the plurality of navigations instructions satisfy the interruption threshold.

In some examples, interruption module 75 may periodically update the determination of whether the interruption condition will be satisfied by one or more of the plurality of navigation instructions. As one example, where interruption module 75 previously determined that the interruption condition will be satisfied until after output of a particular navigation instruction, interruption module 75 may output an updated indication to computing device 4 responsive to determining that the interruption condition will no longer be satisfied until after output of the particular navigation instruction. As another example, where interruption module 75 previously determined that the interruption condition will not be satisfied until after output of a particular navigation instruction, interruption module 75 may output an updated indication to computing device 4 responsive to determining that the interruption condition will now be satisfied until after output of the particular navigation instruction.

Figure 4:
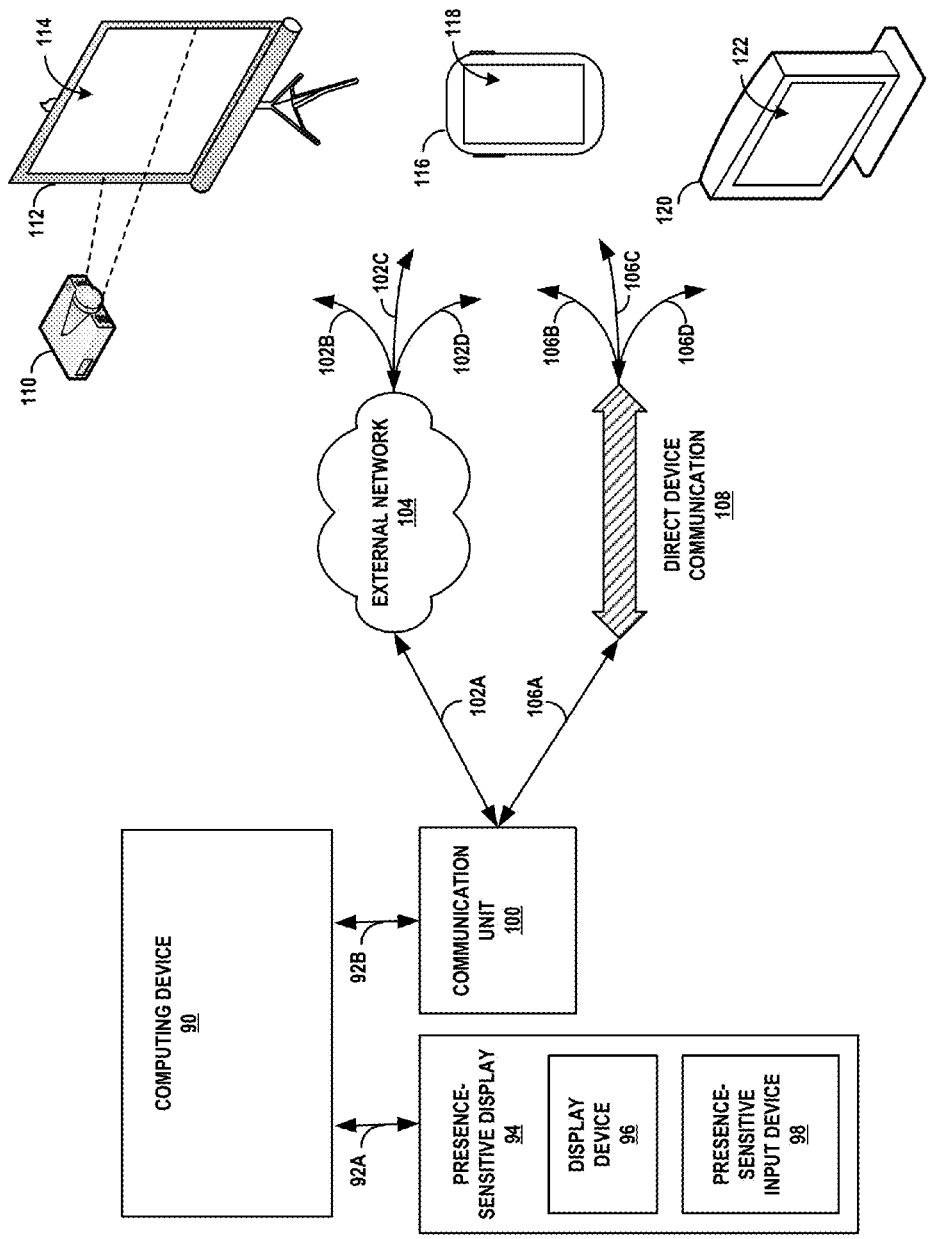
FIG. 4 is a block diagram illustrating an example system that outputs graphical content for display at a remote device, in accordance with one or more techniques of the present disclosure.

FIG. 4 is a block diagram illustrating an example computing device that outputs graphical content for display at a remote device, in accordance with one or more techniques of the present disclosure. Graphical content, generally, may include any visual information that may be output for display, such as text, images, a group of moving images, etc. The example shown in FIG. 4 includes a computing device 90, presence-sensitive display 94, communication unit 100, projector 110, projector screen 112, mobile device 116, and visual display device 120. Although shown for purposes of example in FIGS. 1 and 2 as stand-alone computing device 4, a computing device, such as computing device 90 may, generally, be any component or system that includes a processor or other suitable computing environment for executing software instructions and, for example, need not include a presence-sensitive display.

As shown in the example of FIG. 4, computing device 90 may be a processor that includes functionality as described with respect to processor 40 in FIG. 2. In such examples, computing device 90 may be operatively coupled to presence-sensitive display 94 by a communication channel 92A, which may be a system bus or other suitable connection. Computing device 90 may also be operatively coupled to communication unit 100, further described below, by a communication channel 92B, which may also be a system bus or other suitable connection. Although shown separately as an example in FIG. 4, computing device 90 may be operatively coupled to presence-sensitive display 94 and communication unit 100 by any number of one or more communication channels.

In other examples, such as illustrated previously by computing device 4 in FIGS. 1-2, a computing device may refer to a portable or mobile device such as mobile phones (including smart phones), wearable computing devices (including smart watches) laptop computers, etc. In some examples, a computing device may be a desktop computers, tablet computers, smart television platforms, cameras, personal digital assistants (PDAs), servers, mainframes, etc.

Presence-sensitive display 94, like UID 10 of FIG. 1, may include display device 96 and presence-sensitive input device 98. Display device 96 may, for example, receive data from computing device 90 and display the graphical content. In some examples, presence-sensitive input device 98 may determine one or more user inputs (e.g., continuous gestures, multi-touch gestures, single-touch gestures, etc.) at presence-sensitive display 94 using capacitive, inductive, and/or optical recognition techniques and send indications of such user input to computing device 90 using communication channel 92A. In some examples, presence-sensitive input device 98 may be physically positioned on top of display device 96 such that, when a user positions an input unit over a graphical element displayed by display device 96, the location at which presence-sensitive input device 98 corresponds to the location of display device 96 at which the graphical element is displayed. In other examples, presence-sensitive input device 98 may be positioned physically apart from display device 96, and locations of presence-sensitive input device 98 may correspond to locations of display device 96, such that input can be made at presence-sensitive input device 98 for interacting with graphical elements displayed at corresponding locations of display device 96.

As shown in FIG. 4, computing device 90 may also include and/or be operatively coupled with communication unit 100. Communication unit 100 may include functionality of communication unit 42 as described in FIG. 2. Examples of communication unit 100 may include a network interface card, an Ethernet card, an optical transceiver, a radio frequency transceiver, or any other type of device that can send and receive information. Other examples of such communication units may include Bluetooth, 3G, and Wi-Fi radios, Universal Serial Bus (USB) interfaces, etc. Computing device 90 may also include and/or be operatively coupled with one or more other devices, e.g., input devices, output devices, memory, storage devices, etc. that are not shown in FIG. 4 for purposes of brevity and illustration.

FIG. 4 also illustrates a projector 110 and projector screen 112. Other such examples of projection devices may include electronic whiteboards, holographic display devices, and any other suitable devices for displaying graphical content. Projector 110 and projector screen 112 may include one or more communication units that enable the respective devices to communicate with computing device 90. In some examples, the one or more communication units may enable communication between projector 110 and projector screen 112. Projector 110 may receive data from computing device 90 that includes graphical content. Projector 110, in response to receiving the data, may project the graphical content onto projector screen 112. In some examples, projector 110 may determine one or more user inputs (e.g., continuous gestures, multi-touch gestures, single-touch gestures, etc.) at projector screen using optical recognition or other suitable techniques and send indications of such user input using one or more communication units to computing device 90. In such examples, projector screen 112 may be unnecessary, and projector 110 may project graphical content on any suitable medium and detect one or more user inputs using optical recognition or other such suitable techniques.

Projector screen 112, in some examples, may include a presence-sensitive display 114. Presence-sensitive display 114 may include a subset of functionality or all of the functionality of UID 10 as described in this disclosure. In some examples, presence-sensitive display 94 may include additional functionality. Projector screen 112 (e.g., an electronic whiteboard), may receive data from computing device 90 and display the graphical content. In some examples, presence-sensitive display 114 may determine one or more user inputs (e.g., continuous gestures, multi-touch gestures, single-touch gestures, etc.) at projector screen 112 using capacitive, inductive, and/or optical recognition techniques and send indications of such user input using one or more communication units to computing device 80.

FIG. 4 also illustrates mobile device 116 and visual display device 120. Mobile device 116 and visual display device 120 may each include computing and connectivity capabilities. Examples of mobile device 116 may include e-reader devices, convertible notebook devices, hybrid slate devices, wearable computing devices, etc. Examples of visual display device 120 may include other semi-stationary devices such as televisions, computer monitors, etc. As shown in FIG. 4, mobile device 116 may include a presence-sensitive display 118. Visual display device 120 may include a presence-sensitive display 122. Presence-sensitive displays 118, 122 may include a subset of functionality or all of the functionality of UID 10 as described in this disclosure. In some examples, presence-sensitive displays 118, 122 may include additional functionality. In any case, presence-sensitive display 122, for example, may receive data from computing device 90 and display the graphical content. In some examples, presence-sensitive display 122 may determine one or more user inputs (e.g., continuous gestures, multi-touch gestures, single-touch gestures, etc.) at projector screen using capacitive, inductive, and/or optical recognition techniques and send indications of such user input using one or more communication units to computing device 90.

As described above, in some examples, computing device 90 may output graphical content for display at presence-sensitive display 94 that is coupled to computing device 90 by a system bus or other suitable communication channel. Computing device 90 may also output graphical content for display at one or more remote devices, such as projector 110, projector screen 112, mobile device 116, and visual display device 120. For instance, computing device 90 may execute one or more instructions to generate and/or modify graphical content in accordance with techniques of the present disclosure. Computing device 90 may output the data that includes the graphical content to a communication unit of computing device 90, such as communication unit 100. Communication unit 100 may send the data to one or more of the remote devices, such as projector 110, projector screen 112, mobile device 116, and/or visual display device 120. In this way, computing device 90 may output the graphical content for display at one or more of the remote devices. In some examples, one or more of the remote devices may output the graphical content at a presence-sensitive display that is included in and/or operatively coupled to the respective remote devices.

In some examples, computing device 90 may not output graphical content at presence-sensitive display 94 that is operatively coupled to computing device 90. In other examples, computing device 90 may output graphical content for display at both a presence-sensitive display 94 that is coupled to computing device 90 by communication channel 92A, and at one or more remote devices. In such examples, the graphical content may be displayed substantially contemporaneously at each respective device. For instance, some delay may be introduced by the communication latency to send the data that includes the graphical content to the remote device. In some examples, graphical content generated by computing device 90 and output for display at presence-sensitive display 94 may be different than graphical content display output for display at one or more remote devices.

Computing device 90 may send and receive data using any suitable communication techniques. For example, computing device 90 may be operatively coupled to external network 104 using network link 102A. Each of the remote devices illustrated in FIG. 4 may be operatively coupled to network external network 104 by one of respective network links 102B, 102C, and 102D. External network 104 may include network hubs, network switches, network routers, etc., that are operatively inter-coupled thereby providing for the exchange of information between computing device 90 and the remote devices illustrated in FIG. 4. In some examples, network links 102A-102D may be Ethernet, ATM or other network connections. Such connections may be wireless and/or wired connections.

In some examples, computing device 90 may be operatively coupled to one or more of the remote devices included in FIG. 4 using direct device communication 108. Direct device communication 108 may include communications through which computing device 90 sends and receives data directly with a remote device, using wired or wireless communication. That is, in some examples of direct device communication 108, data sent by computing device 90 may not be forwarded by one or more additional devices before being received at the remote device, and vice-versa. Examples of direct device communication 108 may include Bluetooth, Near-Field Communication, Universal Serial Bus, Wi-Fi, infrared, etc. One or more of the remote devices illustrated in FIG. 4 may be operatively coupled with computing device 90 by communication links 106A-106D. In some examples, communication links 106A-106D may be connections using Bluetooth, Near-Field Communication, Universal Serial Bus, infrared, etc. Such connections may be wireless and/or wired connections.

In some examples, in addition to or in place of the graphical content, computing device 90 may output audio content for playback by one or more of the remote devices, such as projector 110, projector screen 112, mobile device 116, and/or visual display device 120. In this way, computing device 90 may output the audio content for playback at one or more of the remote devices. In some examples, one or more of the remote devices may output the audio content at one or more speakers that are included in and/or operatively coupled to the respective remote devices.

In accordance with techniques of the disclosure, computing device 90 may be operatively coupled to visual display device 120 using external network 104. Computing device 90 may output media data. For instance, computing device 90 may send media data that includes a representation a musical track to communication unit 100. Communication unit 100 may send the data that includes the representation of the musical track to visual display device 120 using external network 104. Visual display device 120, in response to receiving the data using external network 104, may cause presence-sensitive display 122 to output the an audible representation of the musical track.

In response to output of a first navigation instruction of a plurality of navigation instructions, computing device 90 may adjust the outputting of the media. For example, computing device 90 may temporarily cease sending the data that includes the representation of the musical track. Additionally, in some examples, computing device 90 may output the first navigation instruction. For instance, computing device 90 may send data that includes an audible and/or a graphical representation of the first navigation instruction to communication unit 100. Communication unit 100 may send the data that includes the audible and/or the graphical representation of the first navigation instruction to visual display device 120 using external network 104. Visual display device 120, in response to receiving the data using external network 104, may cause presence-sensitive display 122 to output the audible and/or the graphical representation of the first navigation instruction.

Responsive to determining that an interruption condition will be satisfied until after output of a second navigation instruction of the plurality of navigation instructions, computing device 90 may maintain the adjustment of the outputting of the media. For example, computing device 90 may continue to cease sending the data that includes the representation of the musical track until after output of the second navigation instruction. Additionally, in some examples, computing device 90 may output the second navigation instruction. For instance, computing device 90 may send data that includes an audible and/or a graphical representation of the second navigation instruction to communication unit 100. Communication unit 100 may send the data that includes the audible and/or the graphical representation of the second navigation instruction to visual display device 120 using external network 104. Visual display device 120, in response to receiving the data using external network 104, may cause presence-sensitive display 122 to output the audible and/or the graphical representation of the second navigation instruction.

After output of the second navigation instruction, computing device 90 may terminate the adjustment of the outputting of the media. For example, computing device 90 may resume sending the data that includes the representation of the musical track. In this way, computing device 90 may maintain adjustment of media output between successive navigation instructions.

Figure 5:
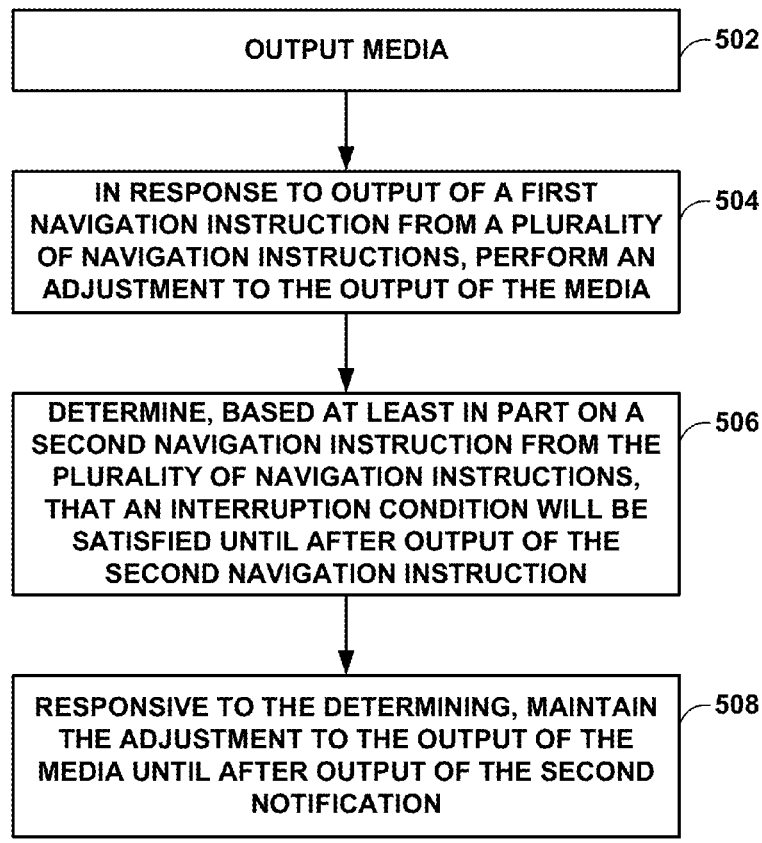
FIG. 5 is a flow diagram illustrating example operations of a computing device to maintaining adjustment of media output between successive navigation instructions, in accordance with one or more techniques of the present disclosure.

FIG. 5 is a flow diagram illustrating example operations of a computing device to maintaining adjustment of media output between successive navigation instructions, in accordance with one or more techniques of the present disclosure. The techniques of FIG. 5 may be performed by one or more processors of a computing device, such as computing device 4 illustrated in FIG. 1 and FIG. 2 and computing device 90 illustrated in FIG. 4. For purposes of illustration, the techniques of FIG. 5 are described within the context of computing device 4 of FIG. 1 and FIG. 3, although computing devices having configurations different than that of computing device 4 may perform the techniques of FIG. 5.

In accordance with one or more techniques of the disclosure, media module 16 computing device 4 may output media (502). In some examples, the media may include audio and/or video data. As discussed above, media module 16 may output the media via one or more output devices that are included in and/or operatively coupled to computing device 4.

In response to output of a first navigation instruction from a plurality of navigation instructions, interruption module 57 of navigation module 16 may perform an adjustment to the output of the media (504). As discussed above, interruption module 57 may perform the adjustment to the output of the media by causing media module 16 to pause, stop, and/or lower a volume level of the media. In some examples, RGM 56 of navigation module 16 may output the first navigation instruction. For instance, RGM 56 may output the first navigation instruction via one or more of the same output devices used by media module 16 to output the media.

Interruption module 57 may determine, based at least in part on a second navigation instruction from the plurality of navigation instructions, that an interruption condition will be satisfied until after output of the second navigation instruction (506). As discussed above, interruption module 57 may determine whether the interruption condition will be satisfied based on one or more of the data points indicated by the plurality of navigation instructions (e.g., predicted output time, distance before, distance after, coordinates, maneuver type, etc.).

Responsive to determining that the interruption condition will be satisfied until after output of the second navigation instruction, interruption module 57 may maintain the adjustment to the output of the media until after output of the second notification (508). As discussed above, responsive to determining that the interruption condition will be satisfied until after output of a third navigation instruction, interruption module 57 may continue to maintain the adjustment of the output of the media until after output of the third notification.

Example 1

A method comprising: outputting, by a computing device, media; performing, by the computing device and prior to output of a first navigation instruction from a plurality of navigation instructions, an adjustment to the outputting of the media; determining, based at least in part on a second navigation instruction from the plurality of navigation instructions, that an interruption condition will be satisfied until after output of the second navigation instruction; and responsive to the determining, maintaining the adjustment to the outputting of the media until after output of the second navigation instruction.

Example 2

The method of example 1, wherein the first navigation instruction is output at a first output time, and wherein determining that the interruption condition will be satisfied until after output of the second navigation instruction comprises: determining a second output time, the second output time associated with the second navigation instruction; and responsive to determining that a difference between the first output time and the second output time is less than a threshold amount of time, determining that the interruption condition will be satisfied until after output of the second navigation instruction.

Example 3

The method of any combination of examples 1-2, further comprising: determining a third output time, the third output time associated with a third navigation instruction from the plurality of navigation instructions, wherein the third output time is subsequent to the second output time; responsive to determining that a difference between the second output time and the third output time is less than the threshold amount of time, determining that the interruption condition will be satisfied until after output of the third navigation instruction; and responsive to determining that the interruption condition will be satisfied until after output of the third navigation instruction, maintaining the adjustment to the outputting of the media until after output of the third navigation instruction.

Example 4

The method of any combination of examples 1-3, further comprising: updating the second output time based on one or more of traffic data and a speed of the computing device; responsive to determining that a difference between the first output time and the second output time for the second navigation instruction is greater than the threshold amount of time, determining that the interruption condition will not be satisfied until after output of the second navigation instruction; and responsive to determining that the interruption condition will not be satisfied until after output of the second navigation instruction, terminating the adjustment to the outputting of the media after output of the first navigation instruction.

Example 5

The method of any combination of examples 1-4, wherein determining the second output time comprises: determining the second output time based one or more of: traffic data, a speed of the computing device, a speed limit of a road indicated by the first navigation instruction, and a distance indicated by the first navigation instruction.

Example 6

The method of any combination of examples 1-5, wherein determining that the interruption condition will be satisfied until after output of the second navigation instruction comprises: responsive to determining that a distance indicated by the first navigation instruction is less than a threshold distance, determining that the interruption condition will be satisfied until after output of the second navigation instruction.

Example 7

The method of any combination of examples 1-6, wherein determining that the interruption condition will be satisfied until after output of the second navigation instruction comprises: determining that a group of navigation instructions from the plurality of navigation instructions are above a threshold likelihood to be output during a particular amount of time, wherein the first navigation instruction is included in the group of navigation instructions and the second navigation instruction is included in the group of navigation instructions; and responsive to determining that a quantity of navigation instructions included in the group of navigation instructions is greater than a threshold quantity, determining that the interruption condition will be satisfied until after output of the second navigation instruction.

Example 8

The method of any combination of examples 1-7, further comprising: receiving, by the computing device, an indication of user input that indicates the threshold quantity.

Example 9

A computing device comprising: one or more processors; and at least one module executable by the one or more processors to: output media; perform, prior to output of a first navigation instruction of a plurality of navigation instructions, an adjustment to the output of the media; determine, based at least in part on a second navigation instruction of the plurality of navigation instructions, that an interruption condition will be satisfied until after output of the second navigation instruction; and responsive to the determining, maintain the adjustment to the output of the media until after output of the second navigation instruction.

Example 10

The computing device of example 9, wherein the first navigation instruction is output at a first output time, and wherein the at least one module is executable by the one or more processors to determine that the interruption condition will be satisfied until after output of the second navigation instruction by at least: determining a second output time, the second output time associated with the second navigation instruction; and responsive to determining that a difference between the first output time and the second output time is less than a threshold amount of time, determining that the interruption condition will be satisfied until after output of the second navigation instruction.

Example 11

The computing device of any combination of examples 9-10, wherein the at least one module is further executable by the one or more processors to: determine a third output time, the third output time associated with a third navigation instruction from the plurality of navigation instructions, wherein the third output time is subsequent to the second output time; responsive to determining that a difference between the second output time and the third output time is less than the threshold amount of time, determine that the interruption condition will be satisfied until after output of the third navigation instruction; and responsive to determining that the interruption condition will be satisfied until after output of the third navigation instruction, maintain the adjustment to the output of the media until after output of the third navigation instruction.

Example 12

The computing device of any combination of examples 9-11, wherein the at least one module is further executable by the one or more processors to: update the a second output time based on one or more of traffic data and a speed of the computing device; responsive to determining that a difference between the first output time and the second output time for the second navigation instruction is greater than the threshold amount of time, determine that the interruption condition will not be satisfied until after output of the second navigation instruction; and responsive to determining that the interruption condition will not be satisfied until after output of the second navigation instruction, terminate the adjustment to the outputting of the media after output of the first navigation instruction.

Example 13

The computing device of any combination of examples 9-12, wherein the at least one module is executable by the one or more processors to determine that the interruption condition will be satisfied until after output of the second navigation instruction by at least: responsive to determining that a distance indicated by the first navigation instruction is less than a threshold distance, determining that the interruption condition will be satisfied until after output of the second navigation instruction.

Example 14

The computing device of any combination of examples 9-13, wherein the at least one module is executable by the one or more processors to determine that the interruption condition will be satisfied until after output of the second navigation instruction by at least: determining that a group of navigation instructions from the plurality of navigation instructions are above a threshold likelihood to be output during a particular amount of time, wherein the first navigation instruction is included in the group of navigation instructions and the second navigation instruction is included in the group of navigation instructions; and responsive to determining that a quantity of navigation instructions included in the group of navigation instructions is greater than a threshold quantity, determining that the interruption condition will be satisfied until after output of the second navigation instruction.

Example 15

The computing device of any combination of examples 9-14, wherein the at least one module is further executable by the one or more processors to: receive an indication of user input that indicates the threshold quantity.

Example 16

A non-transitory computer-readable storage medium storing instructions that, when executed, cause one or more processors of a computing device to: output media; perform, prior to output of a first navigation instruction from a plurality of navigation instructions, an adjustment to the output of the media; determine, based at least in part on a second navigation instruction from the plurality of navigation instructions, that an interruption condition will be satisfied until after output of the second navigation instruction; and responsive to the determining, maintain the adjustment to the output of the media until after output of the second navigation instruction.

Example 17

The non-transitory computer-readable storage medium of example 16, wherein the first navigation instruction is output at a first output time, and wherein the instructions that cause the one or more processors to determine that the interruption condition will be satisfied until after output of the second navigation instruction comprise instructions that cause the one or more processors to: determine a second output time, the second output time associated with the second navigation instruction; and responsive to determining that a difference between the first output time and the second output time is less than a threshold amount of time, determine that the interruption condition will be satisfied until after output of the second navigation instruction.

Example 18

The non-transitory computer-readable storage medium of any combination of examples 16-17, further comprising instructions that cause the one or more processors to: update the second output time based on one or more of traffic data and a speed of the computing device; responsive to determining that a difference between the first output time and the second output time for the second navigation instruction is greater than the threshold amount of time, determine that the interruption condition will not be satisfied until after output of the second navigation instruction; and responsive to determining that the interruption condition will not be satisfied until after output of the second navigation instruction, terminate the adjustment to the outputting of the media after output of the first navigation instruction.

Example 19

The non-transitory computer-readable storage medium of any combination of examples 16-18, wherein the instructions that cause the one or more processors to determine that the interruption condition will be satisfied until after output of the second navigation instruction comprise instructions that cause the one or more processors to: responsive to determining that a distance indicated by the first navigation instruction is less than a threshold distance, determine that the interruption condition will be satisfied until after output of the second navigation instruction.

Example 20

The non-transitory computer-readable storage medium of any combination of examples 16-19, wherein the instructions that cause the one or more processors to determine that the interruption condition will be satisfied until after output of the second navigation instruction comprise instructions that cause the one or more processors to: determine that a group of navigation instructions from the plurality of navigation instructions are above a threshold likelihood to be output during a particular amount of time, wherein the first navigation instruction is included in the group of navigation instructions and the second navigation instruction included in the group of navigation instructions; and responsive to determining that a quantity of navigation instructions included in the group of navigation instructions is greater than a threshold quantity, determine that the interruption condition will be satisfied until after output of the second navigation instruction.

Example 21

A computing device comprising means for performing the method of any combination of examples 1-8.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

The invention claimed is:

1. A method comprising:
   outputting, by a computing device, audio content;
   performing, by the computing device and prior to output of a first audio notification, an adjustment to the outputting of the audio content;
   predicting, prior to output of a second audio notification and based at least in part on the second audio notification, that an interruption condition will be satisfied until after output of the second audio notification; and
   responsive to predicting that the interruption condition will be satisfied until after output of the second audio notification, maintaining the adjustment to the outputting of the audio content until after output of the second audio notification.

2. The method of claim 1, wherein predicting that the interruption condition will be satisfied until after output of the second audio notification is based on determining that a difference between an output time of the first audio notification and an output time of the second audio notification is less than a threshold amount of time.

3. The method of claim 2, further comprising:
   responsive to determining that a difference between the output time of the second audio notification and an output time of a third audio notification is less than the threshold amount of time, predicting that the interruption condition will be satisfied until after output of the third audio notification; and
   responsive to predicting that the interruption condition will be satisfied until after output of the third audio notification, maintaining the adjustment to the outputting of the media until after output of the third audio notification.

4. The method of claim 2, further comprising:
   defining an updated output time of the second audio notification;
   responsive to determining that a difference between the output time of the first audio notification and the updated output time of the second audio notification is greater than the threshold amount of time, predicting that the interruption condition will not be satisfied until after output of the second audio notification; and
   responsive to predicting that the interruption condition will not be satisfied until after output of the second audio notification, terminating the adjustment to the outputting of the audio content after output of the first audio notification.

5. The method of claim 1, wherein predicting that the interruption condition will be satisfied until after output of the second audio notification comprises:
   determining that a group of audio notifications satisfy a threshold likelihood to be output during a particular amount of time, wherein the first audio notification and the second audio notification are included in the group of audio notifications; and
   responsive to determining that a quantity of audio notifications included in the group of audio notifications is greater than a threshold quantity, predicting that the interruption condition will be satisfied until after output of each audio notification of the group of audio notifications.

6. The method of claim 5, further comprising:
   receiving, by the computing device, an indication of user input that indicates the threshold quantity.

7. The method of claim 5, wherein the interruption condition is not satisfied until after output of two consecutive audio notifications where a difference between respective output times of the two consecutive audio notifications is greater than a threshold amount of time unless the two consecutive audio notifications are included in the group of audio notifications that satisfies the threshold likelihood to be output during the particular amount of time and the quantity of audio notifications included in the group of audio notifications is greater than the threshold quantity.

8. The method of claim 1, wherein performing the adjustment comprises one or more of:
   pausing the outputting of the audio content;
   stopping the outputting of the audio content; and
   lowering a volume level of the audio content.

9. A computing device comprising:
   one or more processors; and
   at least one module executable by the one or more processors to:
   output audio content;
   perform, prior to output of a first audio notification, an adjustment to the outputting of the audio content;
   predict, prior to output of a second audio notification and based at least in part on the second audio notification, that an interruption condition will be satisfied until after output of the second audio notification; and
   responsive to predicting that the interruption condition will be satisfied until after output of the second audio notification, maintain the adjustment to the outputting of the audio content until after output of the second audio notification.

10. The computing device of claim 9, wherein the one or more processors are configured to predict that the interruption condition will be satisfied until after output of the second audio notification based on determining that a difference between an output time of the first audio notification and an output time of the second audio notification is less than a threshold amount of time.

11. The computing device of claim 10, wherein the one or more processors are further configured to:
   responsive to determining that a difference between the output time of the second audio notification and an output time of a third audio notification is less than the threshold amount of time, predict that the interruption condition will be satisfied until after output of the third audio notification; and
   responsive to predicting that the interruption condition will be satisfied until after output of the third audio notification, maintain the adjustment to the outputting of the media until after output of the third audio notification.

12. The computing device of claim 10, wherein the one or more processors are further configured to:
- define an updated output time of the second audio notification;
- responsive to determining that a difference between the output time of the first audio notification and the updated output time of the second audio notification is greater than the threshold amount of time, predict that the interruption condition will not be satisfied until after output of the second audio notification; and
- responsive to predicting that the interruption condition will not be satisfied until after output of the second audio notification, terminate the adjustment to the outputting of the audio content after output of the first audio notification.

13. The computing device of claim 9, wherein, to predict that the interruption condition will be satisfied until after output of the second audio notification, the one or more processors are configured to:
- determine that a group of audio notifications satisfy a threshold likelihood to be output during a particular amount of time, wherein the first audio notification and the second audio notification are included in the group of audio notifications; and
- responsive to determining that a quantity of audio notifications included in the group of audio notifications is greater than a threshold quantity, predict that the interruption condition will be satisfied until after output of each audio notification of the group of audio notifications.

14. The computing device of claim 13, wherein the one or more processors are further configured to:
- receive an indication of user input that indicates the threshold quantity.

15. The computing device of claim 13, wherein the interruption condition is not satisfied until after output of two consecutive audio notifications where a difference between respective output times of the two consecutive audio notifications is greater than a threshold amount of time unless the two consecutive audio notifications are included in the group of audio notifications that satisfies the threshold likelihood to be output during the particular amount of time and the quantity of audio notifications included in the group of audio notifications is greater than the threshold quantity.

16. The computing device of claim 9, wherein, to perform the adjustment, the one or more processors are configured to one or more of:
- pause the outputting of the audio content;
- stop the outputting of the audio content; and
- lower a volume level of the audio content.

17. A non-transitory computer-readable storage medium storing instructions that, when executed, cause one or more processors of a computing device to:
- output audio content;
- perform, prior to output of a first audio notification, an adjustment to the outputting of the audio content;
- predict, prior to output of a second audio notification and based at least in part on the second audio notification, that an interruption condition will be satisfied until after output of the second audio notification; and
- responsive to predicting that the interruption condition will be satisfied until after output of the second audio notification, maintain the adjustment to the outputting of the audio content until after output of the second audio notification.

18. The non-transitory computer-readable storage medium of claim 17, wherein the instructions cause the one or more processors to predict that the interruption condition will be satisfied until after output of the second audio notification based on determining that a difference between an output time of the first audio notification and an output time of the second audio notification is less than a threshold amount of time.

19. The non-transitory computer-readable storage medium of claim 18, further comprising instructions that cause the one or more processors to:
- responsive to determining that a difference between the output time of the second audio notification and an output time of a third audio notification is less than the threshold amount of time, predict that the interruption condition will be satisfied until after output of the third audio notification; and
- responsive to predicting that the interruption condition will be satisfied until after output of the third audio notification, maintain the adjustment to the outputting of the media until after output of the third audio notification.

20. The non-transitory computer-readable storage medium of claim 18, further comprising instructions that cause the one or more processors to:
- define an updated output time of the second audio notification;
- responsive to determining that a difference between the output time of the first audio notification and the updated output time of the second audio notification is greater than the threshold amount of time, predict that the interruption condition will not be satisfied until after output of the second audio notification; and
- responsive to predicting that the interruption condition will not be satisfied until after output of the second audio notification, terminate the adjustment to the outputting of the audio content after output of the first audio notification.

* * * * *